United States Patent
Tseng et al.

(10) Patent No.: US 12,532,400 B2
(45) Date of Patent: Jan. 20, 2026

(54) EUV SOURCE WITH ROTATION CRUCIBLE AND LASER AND TIN (SN) AUTO-FILLING METHOD

(71) Applicant: Taiwan Semiconductor Manufacturing Co., Ltd., Hsinchu (TW)

(72) Inventors: Hsin-Fu Tseng, Hsinchu (TW); Chih-Chiang Tu, Hsinchu (TW); Chih-Wei Wen, Hsinchu (TW); Chien-Hsing Lu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 349 days.

(21) Appl. No.: 18/451,026

(22) Filed: Aug. 16, 2023

(65) Prior Publication Data

US 2025/0063649 A1    Feb. 20, 2025

(51) Int. Cl.
*H05G 2/00* (2006.01)
(52) U.S. Cl.
CPC ................. *H05G 2/0035* (2024.08)
(58) Field of Classification Search
CPC ........ H05G 2/005; H05G 2/003; H05G 2/008; H05G 2/0035; H05G 2/0027; H05G 2/0082
See application file for complete search history.

(56) References Cited

U.S. PATENT DOCUMENTS

2024/0004318 A1* 1/2024 Hsu .................. G03F 7/70033
2024/0422888 A1* 12/2024 Lu .................... G03F 7/70916

FOREIGN PATENT DOCUMENTS

| CN | 120174300 A | * | 6/2025 | ............... C23C 4/08 |
|----|-------------|---|--------|-------------------------|
| DE | 10058329 A1 |   | 5/2002 |                         |
| KR | 100884924 B1|   | 2/2009 |                         |
| KR | 101494527 B1|   | 2/2015 |                         |
| TW | 201212726 A |   | 3/2012 |                         |
| TW | 201734459 A |   | 10/2017|                         |

* cited by examiner

*Primary Examiner* — David E Smith
*Assistant Examiner* — Hsien C Tsai
(74) *Attorney, Agent, or Firm* — Seed IP Law Group

(57) ABSTRACT

A tin (Sn) auto-filling device and system provided to provide new liquid Sn to an inner sidewall surface of a rotation crucible. A laser is exposed to the liquid Sn at the inner sidewall surface of the rotation crucible to generate extreme-ultraviolet-light (EUV) that is utilized to process workpieces within a semiconductor manufacturing plant (FAB). The auto-filling device automatically refills as the liquid Sn at the inner sidewall surface of the rotation crucible is consumed due to the liquid Sn at the inner sidewall surface of the rotation crucible being exposed to the laser.

20 Claims, 6 Drawing Sheets

EUV SOURCE WITH ROTATION CRUCIBLE AND LASER AND TIN (SN) AUTO-FILLING METHOD

BACKGROUND

In processing of workpieces and manufacturing of integrated circuit devices, a rotation crucible is utilized along with a laser to generate extreme-ultraviolet (EUV) light. A liquid tin (Sn) is present on an inner sidewall surface of the rotation crucible and the laser is directed at the liquid Sn. When the laser impinges on the liquid Sn, the EUV light is generated. The rotation crucible rotates when the laser impinges on the liquid Sn. Once the liquid Sn is consumed from the laser impinging on the liquid Sn to generate the EUV light, the liquid Sn becomes consumed Sn (e.g., becomes debris) that may drop onto the rotation crucible or be thrown throughout a system containing the rotation crucible due to rotating of the rotation crucible. As more of the liquid Sn is consumed by the laser impinging on the liquid Sn converting the liquid Sn into the consumed Sn, the consumed Sn continues to build up within the system generating the EUV light for processing of workpieces and manufacturing of integrated devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
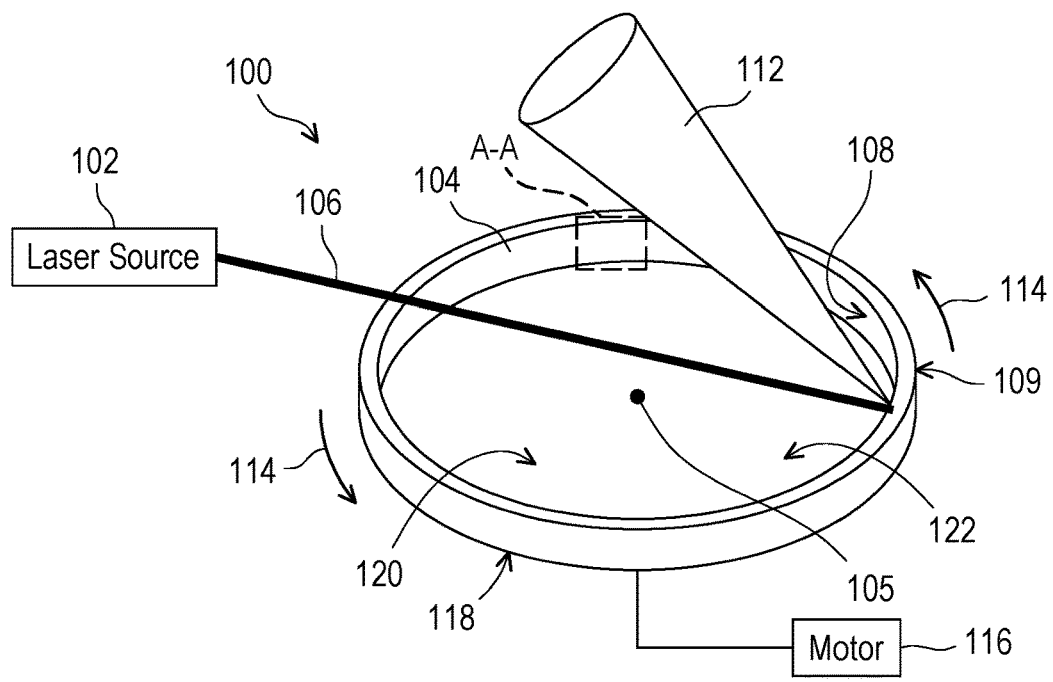
FIG. 1 is a perspective view of a rotation crucible system.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a perspective view of a rotation crucible system 100. As discussed later herein, the rotation crucible system 100 has issues with respect to workpieces being processed out-of-tolerance, which increases waste and operation costs sustained by a semiconductor manufacturing plant (FAB). As discussed later herein, the rotation crucible system 100 has downtime issues with respect to build up of consumed tin (Sn) (e.g., cleaning operations), as well as downtime issues with respect to providing new liquid Sn (e.g., replacement or refueling the rotation crucible system 100 with liquid Sn). The rotation crucible system 100 includes a laser source 102 and a rotation crucible 104. The laser source 102 is configured to, in operation, generate a laser 106 that is directed at an inner sidewall surface 108 of the rotation crucible 104. An outer sidewall surface 109 of the rotation crucible 104 is opposite to the inner sidewall surface 108 of the rotation crucible 104. While not readily visible in FIG. 1, liquid tin (Sn) 110 (see FIG. 2 of the present disclosure) is on, at, and along the inner sidewall surface 108 of the rotation crucible 104. When the laser 106 impinges on the liquid Sn 110 on, at, and along the inner sidewall surface 108 of the rotation crucible 104, an EUV light 112 is generated and is emitted from the inner sidewall surface 108 of the rotation crucible 104. An angle at which the laser 106 impinges on the liquid Sn 110 results in the EUV light 112 being directed towards a target (e.g., an EUV pellicle) through which the EUV light 112 passes to pattern a mask or resist layer with openings for further processing of a workpiece (e.g., a semiconductor wafer or structure). For example, when the target is the EUV pellicle, the EUV light 112 passes through the EUV pellicle and is exposed to the mask or resist layer forming the openings in the mask or resist layer. The mask or resist layer that is patterned with these openings are at selected locations through which an etchant passes through to etch or remove portions of various semiconductor material or layers for processing the workpiece (e.g., the semiconductor wafer or structure).

While the laser 106 impinges on the liquid Sn 110 on, at, and along the inner sidewall surface 108 of the rotation crucible 104, the rotation crucible 104 is rotating in a rotation direction as represented by arrows 114. While the rotation direction represented by the arrows 114 is shown to be in a counterclockwise direction, in some other situations, the rotation direction is instead in a clockwise direction. A motor 116 is in mechanical cooperation with the rotation crucible 104 such that the motor 116 rotates the rotation crucible 104 in the rotation direction represented by the arrows 114 when activated. The motor 116 is in mechanical cooperation with an outer surface 118 (e.g., first surface) of the rotation crucible 104, which is a lower surface based on the orientation as shown in FIG. 1. An inner surface 120 (e.g., second surface) of the rotation crucible 104 is opposite to the outer surface 118, and the inner surface 120 is an upper surface based on the orientation as shown in FIG. 1.

A recess or opening 122 of the rotation crucible 104 is delimited at least by the inner sidewall surface 108 and the inner surface 120 of the rotation crucible 104. The inner sidewall surface 108 extends around the recess 122 as the rotation crucible 104 has a round profile, which in this instance is a circular profile.

The rotation crucible 104 includes a base portion 123 and a sidewall portion 125. The base portion 123 is transverse to the sidewall portion 125, and the sidewall portion extends from the base portion 123.

Generally, the rotation crucible system 100 is utilized to manufacture various respective types of integrated circuits, electronic components, or electronic devices by processing semiconductor workpieces (e.g., semiconductor wafers) through various steps within a semiconductor manufacturing plant (FAB) and by utilizing several processing tools. For example, in at least one situation, the mask or resist layer is formed on a surface of substrate or on a surface of an upper layer of various layers stacked on a substrate. The mask or resist layer is exposed to the extreme-ultraviolet (EUV) light 112 to pattern the mask or resist layer. As discussed earlier herein, in at least one instance, the EUV light 112 passes through the EUV pellicle before impinging on the mask or resist layer such that selected locations and portions of the mask or resist layer are deteriorated and removed. The deterioration or removal of the portions of the mask or resist layer at the selected locations forms the openings in the mask or resist layer as discussed earlier herein. Once the mask or resist layer is patterned by being exposed to the EUV light 112, an etching or patterning step is performed to either etch or pattern the substrate or to etch or pattern various layers formed on the substrate that are exposed from the mask or resist layer through the openings in the mask or resist layer.

To generate the EUV light 112 that is utilized to pattern the mask or resist layer, the liquid Sn present on the inner sidewall surface 108 of the rotation crucible 104 of the rotation crucible system 100 is exposed to the laser 106 such that the laser 106 impinges on the liquid Sn 110. The rotation crucible 104 rotates in the rotation direction represented by the arrows 114 when the laser 106 impinges on the liquid Sn 110 to generate the EUV light 112. The impinging of the laser 106 on the liquid Sn 110 results in the EUV light 112 being generated, which is then directed towards the mask or resist layer to pattern the mask or resist layer as discussed above. As the laser 106 impinges on the liquid Sn 110, the liquid Sn 110 eventually becomes consumed after being exposed to the laser 106 for a period of time. At least some of the consumed Sn releases from the inner sidewall surface 108 of the rotation crucible 104 and becomes debris that drops onto the rotation crucible 104 such that the consumed Sn builds up on the inner surface 120 of the rotation crucible 104, within other areas of the rotation crucible system 100, or within other areas of a processing tool in which the rotation crucible system 100 is present. This buildup of the consumed Sn eventually causes interference with the laser 106 preventing or reducing the generation of the EUV light or causes interference with the EUV light 112 such that less of the EUV light reaches the mask or resist layer. This interference increases a likelihood of workpieces being processed out-of-tolerance, which decreases a yield of a number of the integrated circuits, electronic components, or electronic devices that are within selected tolerances of sufficient quality to be sold to a customer or consumer. These out-of-tolerance integrated circuits, electronic components, or electronic devices become waste and increase both waste and operation costs sustained by the FAB.

Figure 2:
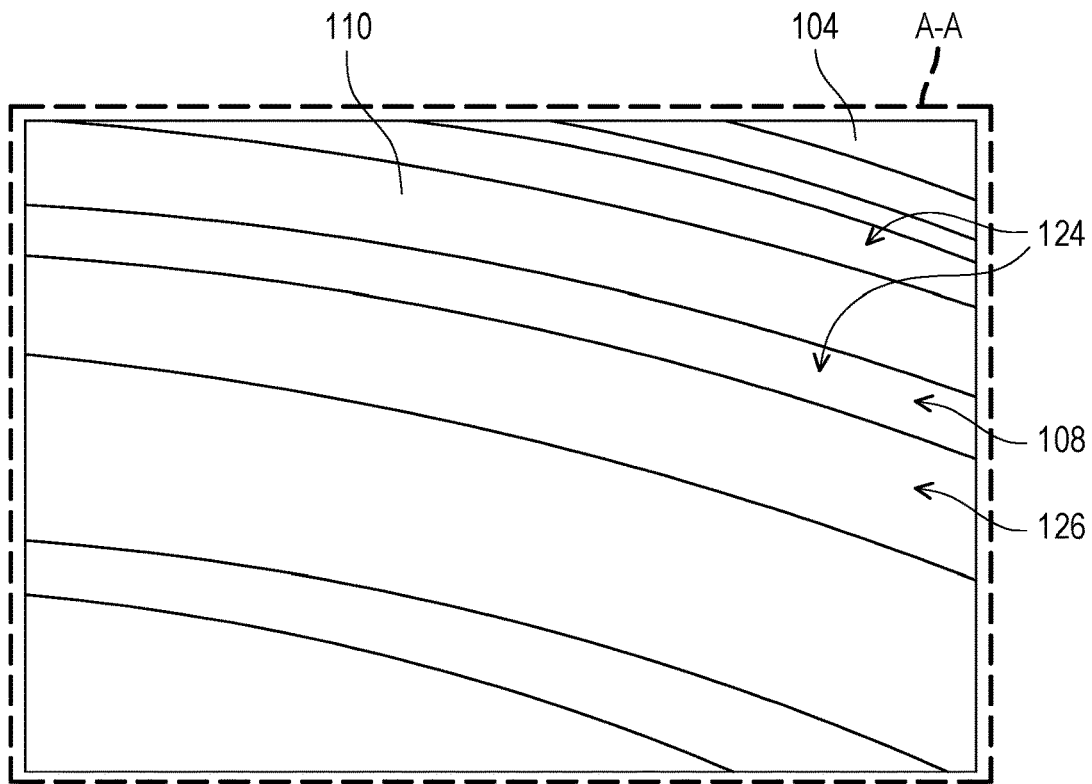
FIG. 2 is a zoomed in, enhanced view of a liquid tin (Sn) on, at, and along an inner sidewall surface of the rotation crucible of the rotation crucible system at section A-A as shown in FIG. 1.

FIG. 2 is a zoomed in, enhanced view of the liquid Sn 110 on, at, and along the inner sidewall surface 108 of the rotation crucible 104 of the rotation crucible system 100 at the section A-A as shown in FIG. 1 after being exposed to the laser 106 for a period of time. The laser 106 has been impinging on the liquid Sn 110 such that the liquid Sn 110 is no longer of sufficient quality or amount to generate the EUV light 112. For example, in at least some instances, the liquid Sn 110 is no longer of sufficient quality or amount to generate the EUV light 112 after the processing tool containing the rotation crucible system 100 has been utilized for about three days to generate the EUV light 112.

As the liquid Sn 110 is consumed to generate the EUV light 112, the liquid Sn 110 eventually is consumed enough such that the liquid Sn 110 present on the inner sidewall surface 108 of the rotation crucible 104 is no longer sufficient in either quality or amount to generate the EUV light 112. As shown in FIG. 2, in first regions 124 along the inner sidewall surface 108 of the rotation crucible 104, the liquid Sn 110 is no longer present such that the actual inner sidewall surface 108 of the rotation crucible is exposed. The liquid Sn 110 previously present at these first regions 124 has entered the rotation crucible system 100 or other areas of the processing tool containing the rotation crucible system 100 as debris, which as discussed earlier herein causes interference with the laser 106 or the EUV light 112. As shown in FIG. 2, in at least one second region 126, the majority of the liquid Sn 110 on the inner sidewall surface 108 has been consumed such that a minority of the second region 126 of the inner sidewall surface 108 is covered by the liquid Sn 110 still remaining within the second region 126. The majority of the liquid Sn previously present at the second region 126 has entered the rotation crucible system or other areas of the processing tool containing the rotation crucible system 100 as debris, which as discussed earlier herein causes interference with the laser 106 or the EUV light 112.

Once the liquid Sn 110 is no longer of sufficient quality or amount on, at, and along the inner sidewall surface 108 of the rotation crucible 104, the rotation crucible system 100 must be stopped resulting in downtime of the processing tool in which the rotation crucible system 100 is present to provide new liquid Sn to generate the EUV light 112. For example, in at least one instance, the rotation crucible 104 with the insufficient quality or amount of the liquid Sn 110 is entirely replaced by a new rotation crucible with new liquid Sn on a respective inner sidewall surface. However, this downtime of the processing tool containing the rotation crucible system 100 reduces the yield of the number of processed workpieces in manufacturing the integrated circuits, electronic components, or electronic devices within the FAB. This reduced yield of the number of processed workpieces reduces income by the FAB as a fewer number of the integrated circuits, electronic components, or electronic devices are manufactured in total within a single day (i.e., 24 hours).

The present disclosure is directed to providing one or more embodiments of a rotation crucible system 200, as well as a method of utilizing the one or more embodiments of the rotation crucible system 200, that prevents or reduces the likelihood of processing the workpieces out-of-tolerance and reduces the downtime issues as discussed above. In other words, the one or more embodiments of the rotation crucible system 200, prevents or reduces the likelihood of the issues as discussed above with respect to the rotation crucible system 100 as shown in FIGS. 1 and 2. Preventing or reducing of processing the workpieces out-of-tolerance by utilizing the rotation crucible system 200 instead of the rotation crucible system 100, decreases both waste costs and operation costs sustained by the FAB. Reducing the downtime of the processing tool containing the rotation crucible system 200 instead of the rotation crucible system 100 by increasing the time between cleanings or by automatically providing new liquid Sn (e.g., auto-filling), increases the yield of the number of processed workpieces increasing the yield of the number of the integrated circuits, electronic components, or electronic devices that are manufactured in total within a single day increasing profits obtained by the FAB.

Figure 3A:
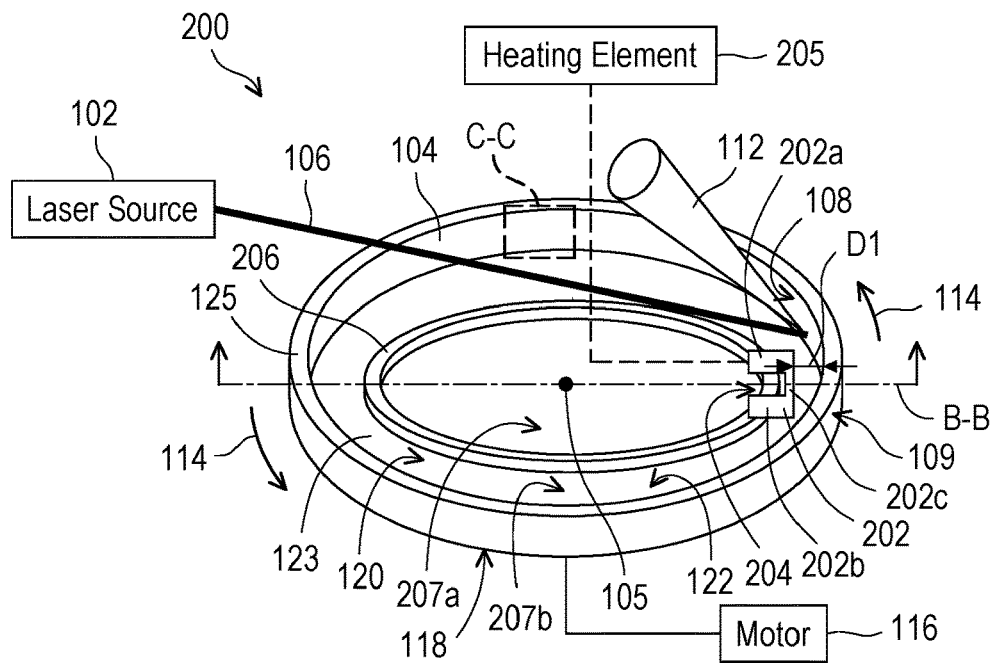
FIG. 3A is a perspective view of a rotation crucible system, in accordance with some embodiments.

FIG. 3A is directed to a perspective view of the rotation crucible system 200, in accordance with some embodiments. The rotation crucible system 200 includes several of the same or similar features of the rotation crucible system 100. These same or similar features of the rotation crucible system 200 with respect to the rotation crucible system 100 have been provided with the same reference numerals. For the purposes of simplicity and brevity of the present disclosure, at least some of the details of these same or similar features between the rotation crucible system 200 (see FIG. 3A) and the rotation crucible system 100 (see FIG. 1) will not be reproduced herein.

The rotation crucible system 200 includes the laser source 102, the rotation crucible 104, and the motor 116. However, unlike the rotation crucible system 100 as shown in FIG. 1, the rotation crucible system 200 as shown in FIG. 3A includes a melting plate 202 that is configured to, in operation, melt a solid Sn into new liquid Sn to automatically provide (i.e., auto-fill) new fuel to generate the EUV light 112, which will be discussed later herein with respect to FIGS. 6 and 7A-7C of the present disclosure. The melting plate 202 includes a first sidewall portion 202a, a second sidewall portion 202b opposite to the first sidewall portion 202a, and a third sidewall portion 202c transverse to the first and second sidewall portions 202a, 202b. The third sidewall portion 202c extends from the first sidewall portion 202a to the second sidewall portion 202b and couples the first sidewall portion 202a to the second sidewall portion 202b. In at least one embodiment, the first, second, and third sidewall portions 202a, 202b, 202c are made of a single continuous material. The first, second, and third sidewall portions 202a, 202b, 202c are made of a tungsten (W) material or tungsten-based material. As shown in FIG. 3A, the first, second, and third sidewall portions 202a, 202b, 202c of the melting plate 202 result in the melting plate 202 having a U-shape or C-shape profile. The first, second, and third sidewall portions 202a, 202b, 202c of the melting plate 202 define an opening or space 204 that is delimited along three sides by the melting plate 202. In some embodiments, the melting plate 202 is of some other size and shape and is structured to receive the solid Sn 310 such that the solid Sn 310 is heated and melted by the melting plate 202 when heated to a temperature equal to or slightly greater than the temperature to melt the solid Sn 310 from a solid state to a semi-liquid state or a liquid state.

A first dimension D1 extends from the third sidewall portion 202c to the inner sidewall surface 108 of the rotation crucible 104. The first dimension D1 is within range from 5-millimeters (mm) to 10-millimeters (mm) or is equal to the upper and lower ends of this range.

The rotation crucible 104 includes a center 105 about which a central axis passes through. The first and second sidewall portions 202a, 202b of the melting plate 202 are between the center 105 and the third sidewall portion 202c of the melting plate 202. In other words, the first and second sidewall portions 202a, 202b are closer to the center 105 of the rotation crucible 104 than the third sidewall portion 202c of the melting plate 202 is to the center 105 of the rotation crucible 104.

Unlike the rotation crucible 104 as shown in FIG. 1, the rotation crucible 104 as shown in FIG. 3A further includes a boundary protrusion, extension, or portion 206 that extends from the inner surface 120 of the rotation crucible 104. The boundary protrusion 206 prevents or reduces the likelihood of consumed Sn (e.g., debris Sn) from entering a central region 207a of the rotation crucible 104. The central region 207a of the rotation crucible is centered on the center 105 and is surrounded by the boundary protrusion 206 and is delimited by the boundary protrusion 206. A peripheral region 207b is spaced outward from the boundary protrusion 206, and the peripheral region 207b is between the boundary protrusion 206 and the inner sidewall surface 108 of the sidewall portion 125.

A heating element 205 is in thermal communication with the melting plate 202. The heating element 205 is configured to, in operation, heat the melting plate 202 to a temperature either equal to or slightly greater than a melting temperature of solid Sn to convert solid Sn to new liquid Sn.

Figure 3B:
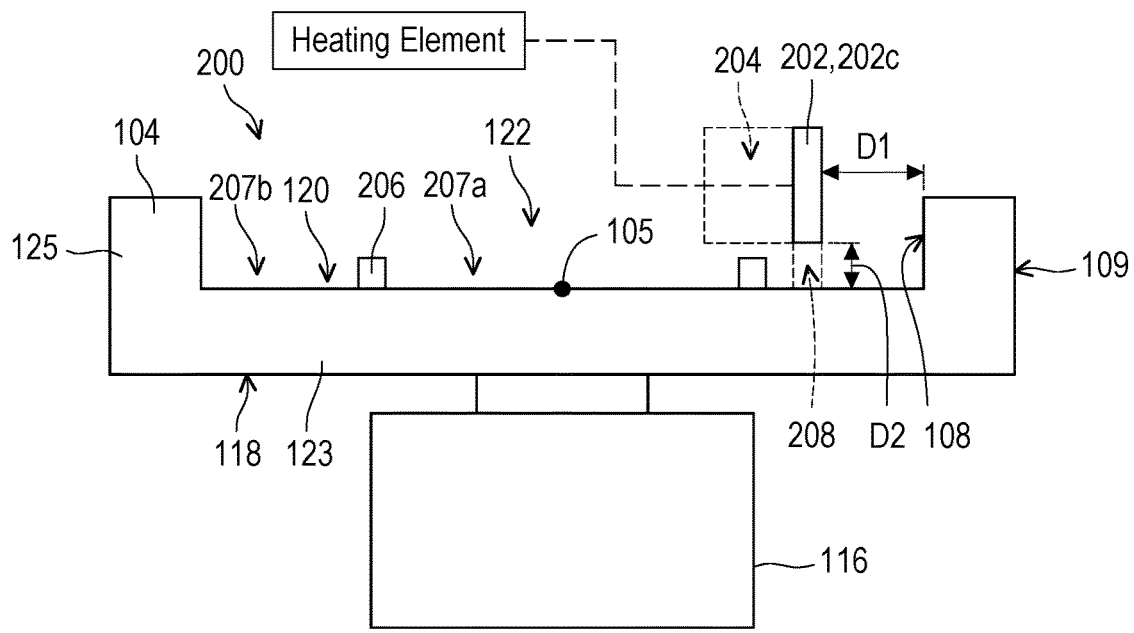
FIG. 3B is a cross-sectional side view of the rotation crucible system taken along line B-B as shown in FIG. 3A, in accordance with some embodiments.
Figure 3C:
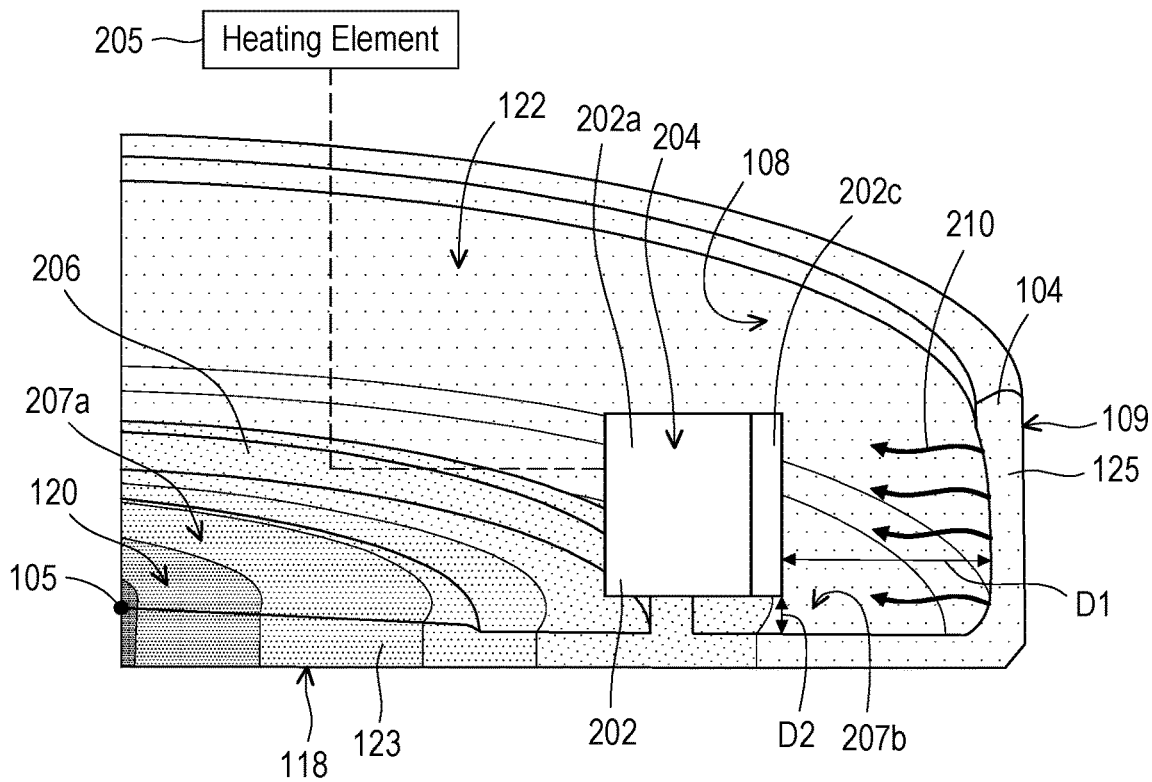
FIG. 3C is a zoomed in, enhanced, perspective cross-sectional side view of the rotation crucible system as shown in FIG. 3A taken along line B-B as shown in FIG. 3A, in accordance with some embodiments.

FIG. 3B is a cross-sectional side view of the rotation crucible system 200 taken along line B-B as shown in FIG. 3A, in accordance with some embodiments. As shown in FIG. 3B, the motor 116 is in mechanical cooperation with the outer surface 118 of the rotation crucible 104 such that the motor 116 is configured to, in operation, rotate the rotation crucible 104 in the rotation direction as represented by the arrows 114.

The melting plate 202 is suspended over the inner surface 120 of the base portion 123 of the rotation crucible 104 by a second dimension D2. The second dimension D2 is within range from 0.3-millimeters (mm) to 0.5-millimeters (mm) or is equal to the upper and lower ends of this range. A space 208 is between the melting plate 202 and the inner surface 120 of the base portion 123. The space 208 is encircled by a dotted square between a lower end of the melting plate 202 and the inner surface 120 of the base portion 123 based on the orientation as shown in FIG. 3B.

As shown in FIG. 3B, an upper end of the boundary protrusion 206 is spaced apart from the lower end of the melting plate 202. The space between the boundary protrusion 206 is selected to be relatively small to prevent or reduce the likelihood of consumed Sn (e.g., Sn debris) from entering into the central region 207a of the rotation crucible 104.

As discussed earlier herein, while the rotation crucible 104 is in mechanical cooperation with the motor 116 to rotate the rotation crucible 104 in the rotation direction as represented by the arrows 114, the melting plate 202 is suspended over the rotation crucible 104 and is fixed or held in a stationary position. In other words, while the rotation crucible 104 rotates, the melting plate remains in the stationary position as shown in FIG. 3A.

Figure 4:
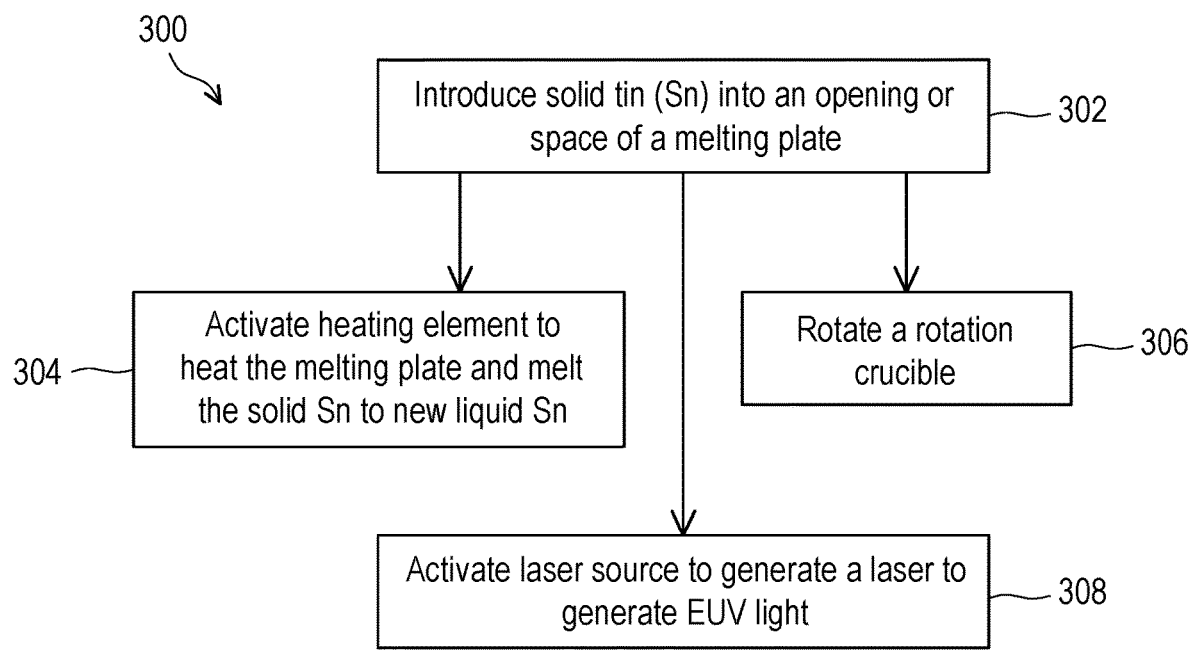
FIG. 4 is a flowchart of a method of auto-filling the rotation crucible system as shown in FIG. 3A to introduce new liquid tin (Sn) on, at, and along the inner sidewall surface of the rotation crucible of the rotation crucible system as shown in FIG. 3A, in accordance with some embodiments.

FIG. 4 is a zoomed in, enhanced, perspective cross-sectional side view of the rotation crucible system 200 as shown in FIG. 3A taken along line B-B as shown in FIG. 3A, in accordance with some embodiments.

A heat gradient of the rotation crucible 104 is shown in FIG. 4. The heat gradient is representative of respective temperatures along respective locations of the rotation crucible 104 when the laser 106 is emitted by the laser source 102 to generate the EUV light 112 by the laser 106 impinging on the liquid Sn 110. The heat gradient increases in a direction directed from the center 105 of the rotation crucible 104 to the sidewall portion 125 of the rotation crucible 104. In other words, a first temperature at the center 105 of the rotation crucible 104 is less than a second temperature at the sidewall portion 125. Respective intermediate temperatures at respective intermediate locations of the rotation crucible 104 between the center 105 and the sidewall portion 125 are between the first temperature and the second temperature. Generally, the first temperature at the center 105 is the lowest temperature of the rotation crucible 104 and the second temperature at the sidewall portion is the highest temperature of the rotation crucible.

Heat radiates outward from the inner sidewall surface 108 of the sidewall portion of the rotation crucible and is represented by arrows 210. The heat 210 radiates outward from the inner sidewall surface 108 due to the laser 106 impinging on the liquid Sn 110 on, at, and along the inner sidewall surface 108.

The third sidewall portion 202c of the melting plate 202 is spaced inward from the inner sidewall surface 108 of the sidewall portion 125 by the first dimension D1 such that the heat 210 that radiates outward from the inner sidewall surface 108 of the sidewall portion 125 of the rotation crucible 104 has minimal or no effect on a temperature of the melting plate 202. For example, when the heating element 205 is activated, if the melting plate 202 was instead in close proximity to the inner sidewall surface 108 instead of at the first dimension D1, the heat 210 would result in the temperature of the melting plate 202 increasing or fluctuating above the temperature equal to or just slightly greater than the melting temperature of solid Sn. The temperature of the melting plate 202 increasing due to being too close to the inner sidewall surface 206 by the heat 210 causes physical characteristics of new liquid Sn being introduced into the rotation crucible 104 to be out-of-tolerance. To allow for the heating element 205 to properly heat up the melting plate 202, the melting plate 202 is instead positioned at the first dimension D1 from the inner sidewall surface 108.

As discussed above, to prevent or reduce the likelihood of new liquid Sn being introduced outside of selected tolerances, the melting plate 202 is spaced apart from the inner sidewall surface 108 by the first dimension D1 such that the heat 210 has minimal to no effect on the temperature of the melting plate 202. For example, when the melting plate 202 is heated by the heating element 205 to the temperature equal to or just slightly greater than the melting temperature of solid Sn to introduce new liquid Sn to the inner sidewall surface 108 by being at the first dimension D1 as shown in FIG. 4, the heat 210 has minimal to no effect on the temperature of the melting plate 202. In other words, the temperature of the melting plate 202 is equal to or just slightly greater than the melting temperature of solid Sn. This allows for the melting plate 202 to be easily maintained in a controlled manner at the temperature equal to or just slightly greater than the melting temperature of solid Sn to introduce new liquid Sn to the inner sidewall surface 108. The temperature of the melting plate 202 being easily maintained at the temperature equal to or just slightly greater than the melting temperature of solid Sn allows for the new liquid Sn to be introduced with physical characteristics within selected tolerances.

Being able to easily and effectively control the temperature of the melting plate 202 with the heating element 205 to be equal to or just slightly greater than the melting temperature of solid Sn improves power efficiency of the heating element 205 to heat up and control the temperature of the melting plate 202. The improved power efficiency allows for operation costs of the FAB to be reduced increasing profits output by the FAB.

Figure 5A:
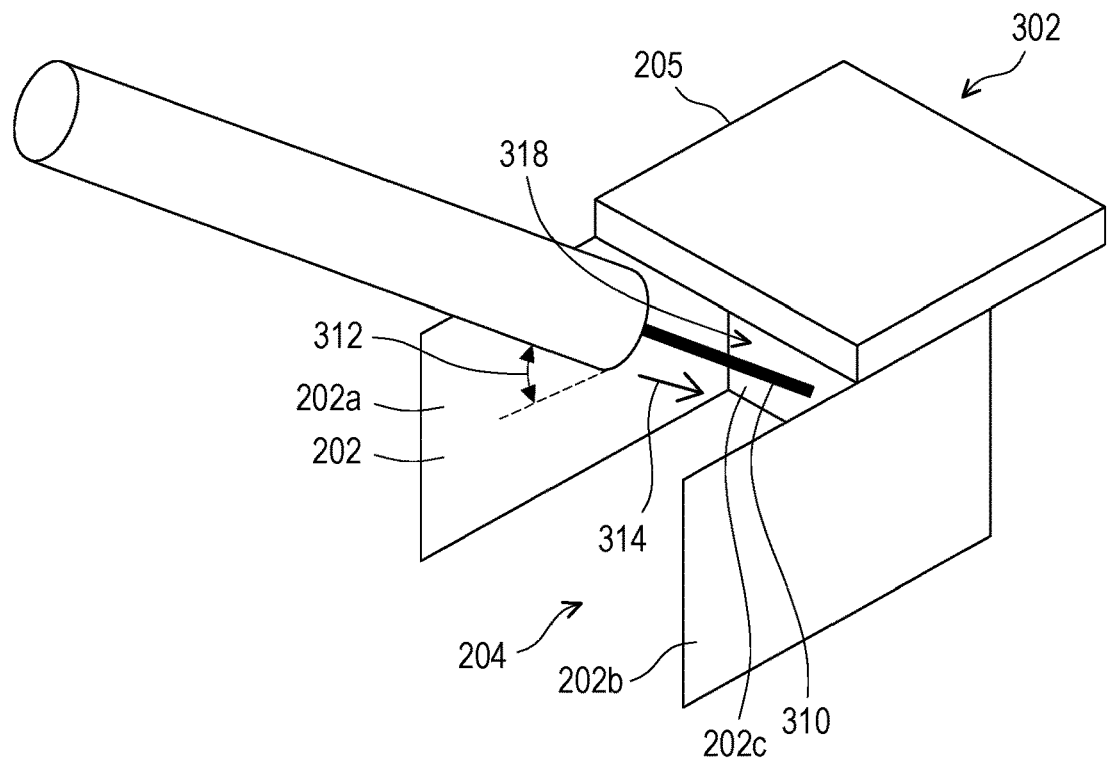
FIG. 5A is a perspective view of a respective step of the flowchart as shown in FIG. 4, in accordance with some embodiments.
Figure 5B:
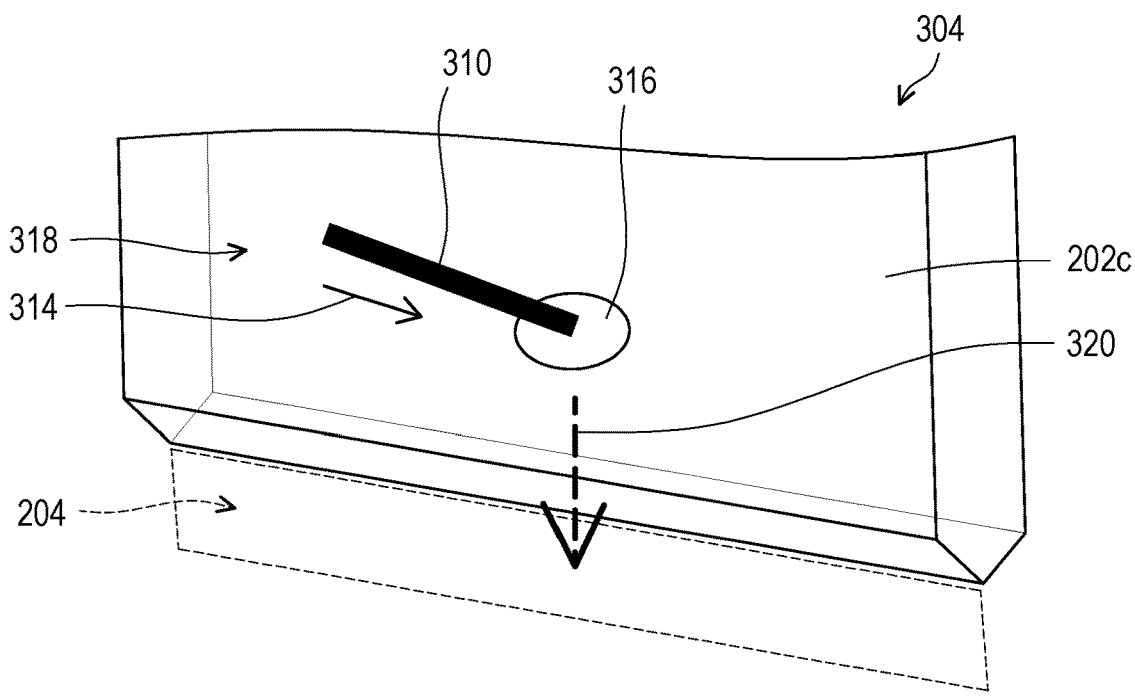
FIG. 5B is a zoomed in, perspective view of a respective step of the flowchart as shown in FIG. 4, in accordance with some embodiments.
Figure 5C:
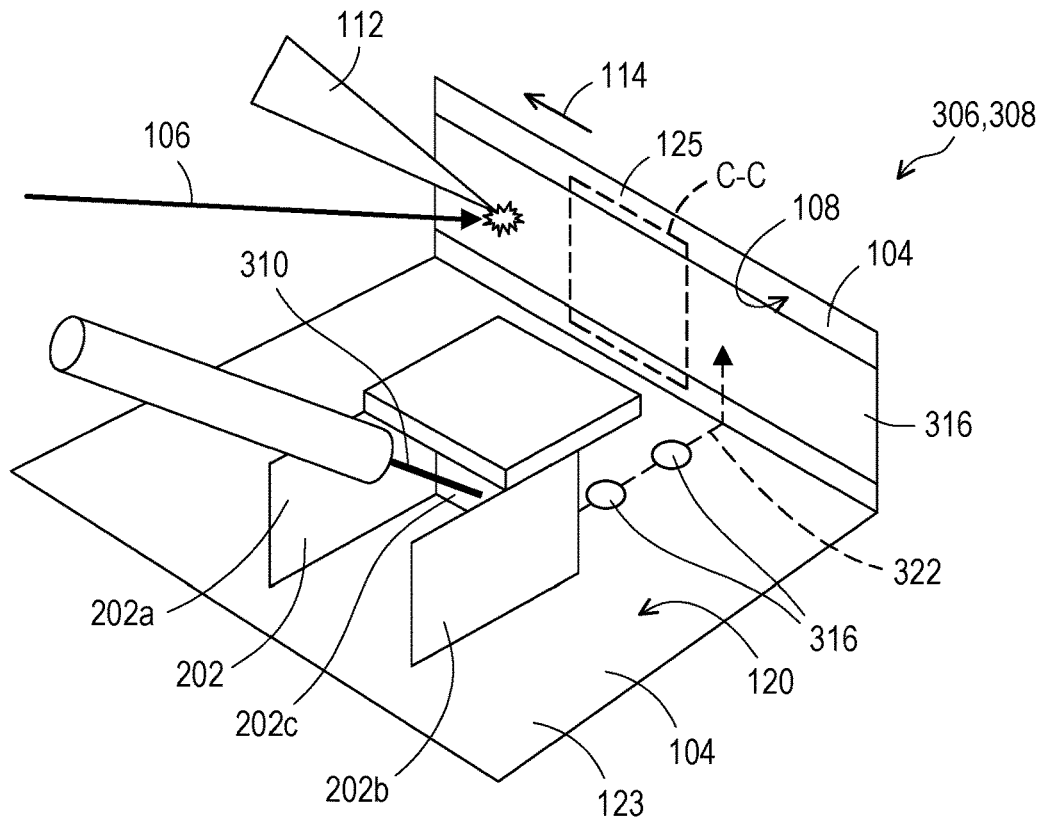
FIG. 5C is a perspective view of a respective step of the flowchart as shown in FIG. 4, in accordance with some embodiments.

FIG. 4 is a flowchart 300 of a method of auto-filling the rotation crucible system 200 as shown in FIGS. 3A and 3B, in accordance with some embodiments. The flowchart 300 includes a plurality of steps 302, 304, 306, 308. FIG. 5A is a perspective view of a respective step 302 of the flowchart 300 as shown in FIG. 4, in accordance with some embodiments. FIG. 5B is a zoomed in, perspective view of a respective step 304 of the flowchart 300 as shown in FIG. 4, in accordance with some embodiments. FIG. 5C is a perspective view of a respective steps 306, 308 of the flowchart 300 as shown in FIG. 4, in accordance with some embodiments.

In a first step 302, a solid Sn 310, which may be referred to as an Sn insert, is inserted into the space 204 of the melting plate 202 that is delimited or defined by the first, second, and third sidewall portions 202a, 202b, 202c of the melting plate 202. The solid Sn 310 may be referred to as a solid EUV fuel, a solid EUV fuel insert, or some other similar or like reference to the solid Sn 310. In some embodiments, the solid EUV fuel may be some other suitable type of solid EUV fuel. The solid Sn 310 is Sn in a solid state. For example, the solid Sn 310 may be an Sn wire or some other type of solid Sn insert that may be inserted into the space 204 to be melted by the melting plate 202 when heated by the heating element 205. As shown in FIG. 5A, the solid Sn is introduced at an angle 312 relative to a plane parallel with the inner surface 120 of the rotation crucible 104. The solid Sn 310 being inserted into the space 204 is represented by an arrow 314 as shown in FIG. 5A.

After the first step 302 in which the solid Sn 310 has been inserted into the space 204 of the melting plate 202, in a second step the heating element 205 is activated to heat the melting plate 202. The heating element 205 is a local heater or local heating element that is in thermal communication with the melting plate 202 such that the heating element 205 heats the melting plate to the temperature equal to or just slightly greater than the melting temperature of the solid Sn 310. The melting temperature of solid Sn being 449.5 degrees-Fahrenheit (231.9 degrees-Celsius). Once the melting plate 202 is at the temperature equal to or just slightly greater than the melting temperature of the solid Sn 310, the solid Sn 310 melts and is converted from a solid state to a liquid state as shown in FIGS. 5B and 5C. New liquid Sn 316, which may be referred to as new liquid EUV fuel, due to the melting of the solid Sn 310 is then introduced to the rotation crucible 104 as shown in FIGS. 5B and 5C. In some embodiments, the new liquid EUV fuel may be some other type of suitable type of EUV fuel.

The solid Sn 310 melts when the solid Sn 310 comes into close proximity or into physical contact with an internal surface 318 of the third sidewall portion 202c of the melting plate 202. When the solid Sn 310 melts into the new liquid Sn 316, the new liquid Sn 316 is in the form of liquid Sn droplets. The new liquid Sn 316, which is in droplet form, moves along the internal surface 318 of the third sidewall portion 202c of the melting plate 202 due to gravity and falls past the lower end of the melting plate 202 onto the inner surface 120 of the rotation crucible 104. The path of which the new liquid Sn 316 moves along the internal surface 318 and falls onto the inner surface 120 due to gravity is represented by a dotted arrow 320 as shown in FIG. 5B. The new liquid Sn 316, which is in droplet form, falls onto a region of the inner surface 120 of the rotation crucible 104 that is within the peripheral region 207b between the boundary protrusion 206 and the inner sidewall surface 108 of the sidewall portion 125.

At the same time as the second step 304, in a third step 306 the motor 116 is activated such that the rotation crucible 104 is rotated in the rotation direction as represented by the arrows 114. In other words, the motor 116 is activated simultaneously along with the heating element 205 such that the new liquid Sn 316, which is in droplet form, drops onto the inner surface 120 of the rotation crucible 104 while the rotation crucible 104 is rotating in the rotation direction as represented by the arrows 114. Once the new liquid Sn 316 drops onto the inner surface 120 of the rotation crucible 104 as the rotation crucible 104 is rotating, a centrifugal force on the new liquid Sn 316 caused by the rotation of the rotation crucible 104 results in the new liquid Sn 316 moving along the inner surface 120 towards the inner sidewall surface 108 of the sidewall portion 125. Once at the inner sidewall surface 108, the new liquid Sn moves upward and along the inner sidewall surface 108 such that the new liquid Sn 316 forms a film or layer on the inner sidewall surface 108. A contact angle between the new liquid Sn and the inner sidewall surface 108 is low (e.g., equal to or close to equal to 0 degrees) such that the film or layer is thin and is spread across the inner sidewall surface 108 of the sidewall portion 125 of the rotation crucible 104. This introduction of the new liquid Sn 316 to the inner sidewall surface 108 replenishes, replaces, or covers the liquid Sn 110 already previously exposed to the laser 106 to generate the EUV light 112. The second and third steps 304, 306 auto-fill the inner sidewall surface 108 with the new liquid Sn 316. This auto-filling prevents or reduces the likelihood of consumed Sn from falling off the inner sidewall surface 108 on the inner surface 120 of the rotation crucible and being thrown around as debris through the processing tool containing the rotation crucible system 200.

This movement of the new liquid Sn 316 along the inner surface 120 and onto the inner sidewall surface 108 of the sidewall portion 125 of the rotation crucible 104 is represented by a dotted arrow 322 as shown in FIG. 5C. The solid Sn 310 is melted into the new liquid Sn 316 until the solid Sn 310 is gone or completely melted.

At the same time as the second step 304 and the third step 306, in a fourth step 308 the laser source 102 generates the laser 106 that impinges on the new liquid Sn 316 on inner sidewall surface 108 to generate the EUV light 112.

In view of the above discussion, the issues with consumed Sn building up and becoming debris as discussed earlier herein with respect to FIGS. 1 and 2 is prevented or reduced in likelihood of occurring by utilizing this auto-filling process in the flowchart 300 along with the rotation crucible system 200. In other words, the first regions 124 along the inner sidewall surface 108 of the rotation crucible 104 at which the liquid Sn 110 has been completely consumed and fallen off the inner sidewall surface 108 is prevented or is reduced in likelihood of occurring when utilizing the rotation crucible system 200 instead of the rotation crucible system 100. Similarly, the second regions 126 along the inner sidewall surface 108 of the rotation crucible 104 at which the majority of the liquid Sn 110 has been consumed and fallen off the inner sidewall surface 108 is prevented or reduced in likelihood of occurring when utilizing the rotation crucible system 200 instead of the rotation crucible system 100. This prevention of the first and second regions 124, 126 from occurring, reduces an amount of debris (i.e., consumed Sn) that builds up. This reduction in the amount of debris increases a period of time between successive cleanings of the processing tool, which reduces downtime of the processing tool due to having to be cleaned less frequently.

This prevention of the first and second regions 124, 126 from occurring, reduces the downtime of the processing tool to have to manually replenish liquid Sn on the inner sidewall surface 108 of the rotation crucible 104. In other words, utilizing the auto-filling method in the flowchart 300 allows for the new liquid Sn 316 to be introduced to continue to generate the EUV light 112 without having to stop operation of the processing tool to manually replenish the liquid Sn by replacing the entirety of the rotation crucible 104 as discussed earlier herein with respect to FIGS. 1 and 2. For example, as discussed earlier herein, while the liquid Sn 110 is no longer of sufficient quality or amount to generate the EUV light 112 after the processing tool containing the rotation crucible system 100 has been utilized for about three days, the processing tool containing the rotation crucible system 200 and utilizing the auto-filling method in the flowchart 300 allows for the new liquid Sn 316 to be introduced and provided for at least up to thirty days before having to perform maintenance on the processing tool containing the rotation crucible system 200 (e.g., cleaning due to consumed Sn debris build or replacement of the solid Sn 310 insert after being completely melted and deteriorated in auto-filling the inner sidewall surface 108 of the rotation crucible 104 for purposes of continuing to generate the EUV light 112). For example, when the solid Sn 310 is completely melted, the processing tool is stopped and a new solid Sn insert is inserted into the space 204 of the melting plate 202 while at the same time debris (i.e., consumed Sn) may be cleaned out.

In at least some alternative embodiments of the auto-filling method of the flowchart 300, at least some of the respective steps 304, 306, 308 are completed in a selected order instead of all simultaneously occurring at substantially the same time. For example, the first step 302 may occur in advance of the second step 304 in which the heating element 205 is activated to heat up the melting plate 202 to the temperature equal to or just slightly greater than the melting temperature of the solid Sn 310 prior to the solid Sn 310 being inserted into the space 204 of the melting plate 202.

Figure 6:
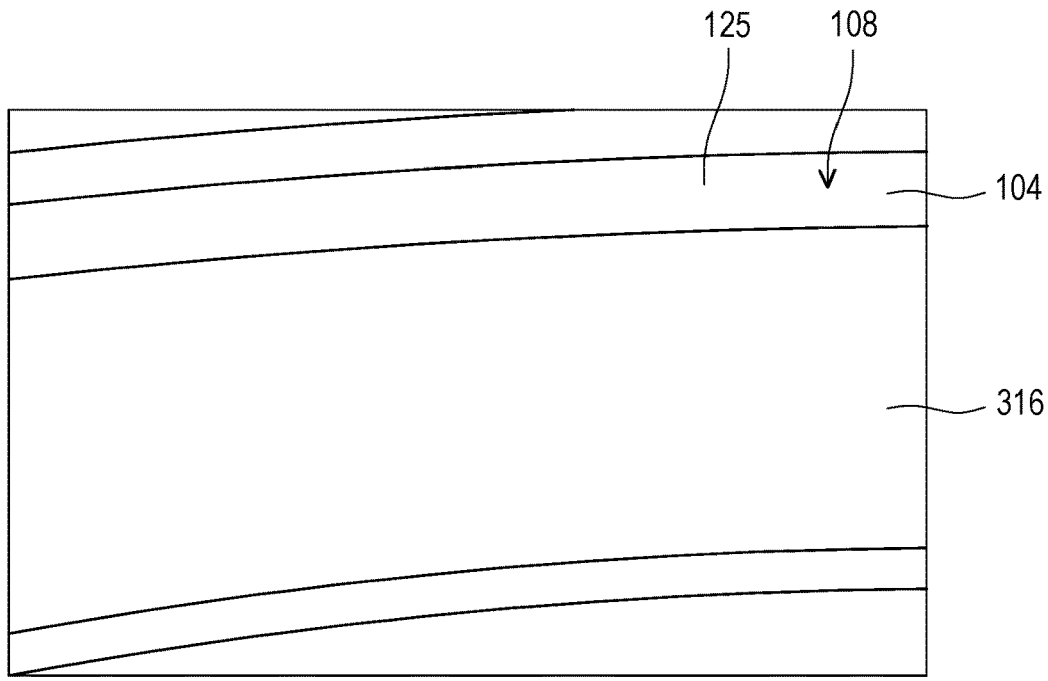
FIG. 6 is a zoomed in, enhanced view of the new liquid tin (Sn) on, at, and along the inner sidewall surface of the rotation crucible of the rotation crucible system at section C-C as shown in FIGS. 3A and 5C as a result of the method of auto-filling the rotation crucible with the new liquid tin (Sn) of FIG. 4, in accordance with some embodiments.

FIG. 6 is a zoomed in, enhanced view of the new liquid tin (Sn) on, at, and along the inner sidewall surface of the rotation crucible of the rotation crucible system at section C-C as shown in FIGS. 3A and 5B as a result of the method of auto-filling the rotation crucible with the new liquid tin (Sn) of FIG. 4, in accordance with some embodiments. As shown in FIG. 6, the new liquid Sn 316 being auto-filled onto the inner sidewall surface 108 of the sidewall portion 125 of the rotation crucible 104 remains completely covered as the laser 106 is exposed to various regions of the new liquid Sn 316 that keeps getting replenished, replaced, or auto-filled onto the inner sidewall surface 108 of the sidewall portion 125 of the rotation crucible 104. As shown in FIG. 6, there are no regions the same or similar to the first and second regions 124, 126 as discussed earlier herein with respect to FIG. 2. In other words, as the solid Sn 310 is melted into the new liquid Sn 316 to replenish, replace, or auto-fill the inner sidewall surface 108 with the new liquid Sn 316, there is a sufficient amount and quality of the new liquid Sn 316 at the inner sidewall surface 108 such that the rotation crucible system 200 has enough fuel to generate the EUV light 112 at least up to thirty days, which is greater than the three days when utilizing the rotation crucible system 100 as discussed earlier herein with respect to FIG. 2.

Figure 7:
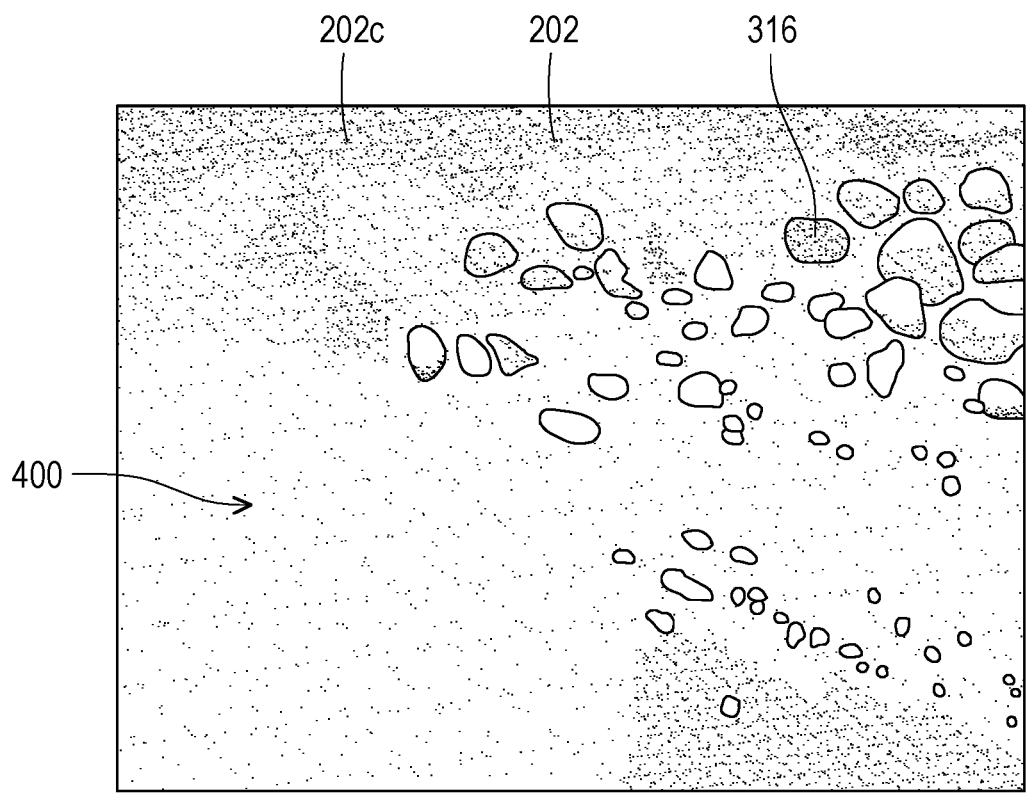
FIG. 7 is a zoomed in, enhanced view of an internal surface of a melting plate of the rotation crucible system as shown in FIGS. 3A and 5B, in accordance with some embodiments.

FIG. 7 is a zoomed in, enhanced view of a surface 400 of the melting plate 202 of the rotation crucible system 200 as shown in FIGS. 3A and 5B, in accordance with some embodiments. This zoomed in, enhanced view of the surface 400 as shown in FIG. 7 is a zoomed in, enhanced view after the melting plate 202 has been utilized to melt the solid Sn 310 completely. For example, the surface 400 as shown in FIG. 7 in some instances is representative of the internal surface 318. The melting plate 202 is made of a tungsten material such that the melting plate does not chemically react with the solid Sn 310 when melting the solid Sn 310 into the liquid Sn 316. The solid Sn 310 not reacting with the tungsten material of the melting plate 202 when melting the solid Sn 310 into the liquid Sn 316 prevents, mitigates, or reduces an amount of Sn that builds up and remains present on the surface 400 of the melting plate 202 when melting the solid Sn 310 into the liquid Sn 316. For example, when the surface 400 is the internal surface 318, if the melting plate 202 were instead made of a material that chemically reacts with the liquid Sn, an Sn alloy could potentially build up and be adhered to the internal surface 318 the melting plate 202 decreasing the amount of liquid Sn droplets that reach the inner sidewall surface 108 of the rotation crucible 104. As shown in FIG. 7, only a minimal or small amount of the liquid Sn 316 remains on the surface 400 of the melting plate 202 after melting the solid Sn 310 into the new liquid Sn 316. Alternatively, if the surface 400 is representative of an external surface of the melting plate opposite to the internal surface 318 of the melting plate 202, any liquid Sn that is unintentionally deposited onto the external surface of the melting plate 202 does not chemically react with the melting plate 202 such that it builds up and adheres to the melting plate 202. In view of the above discussion, by having the melting plate 202 made of the tungsten material or tungsten-based material that does not chemically react with the Sn when melting the solid Sn 310 into the new liquid Sn 316, the melting plate 202 is maintained at a relatively high quality for a longer period of time such that the melting plate 202 needs to be replaced on a less frequent basis increasing times between maintenance operations allowing for the operational time of the processing tool with the rotation crucible system 200 to be increased.

In view of the discussion herein, utilizing the rotation crucible system 200 with the auto-filling method in the flowchart 300 increases an amount of time that the rotation crucible system 200 can continually be utilized to generate the EUV light 112 (e.g., increased usable lifespan). For example, the period of time between cleaning or maintenance operation is increased resulting in an increase in operational time, and the new liquid Sn 316 being continuously replenished, replaced, or auto-filled onto the inner sidewall surface 108 allows for the EUV light 112 to be generated for a much longer period of time (e.g., thirty days) as compared to when utilizing the rotation crucible system 100 (e.g., only has sufficient amounts of liquid Sn to generate the EUV light 112 for three days). Accordingly, the amount of time that the EUV light 112 can be generated by the rotation crucible system 200 is significantly greater than the amount of time that the EUV light 112 can be generated utilizing the rotation crucible system 100. In turn, this increase in the time the EUV light 112 can be generated utilizing the rotation crucible 200 instead of the rotation crucible 100 increases profits obtained by the FAB as a greater number of integrated circuits or semiconductor devices are manufactured within selected tolerances to be sold to consumers or customers.

At least one embodiment of a system of the present disclosure may be summarized as including: a rotation crucible including a surface and an inner sidewall surface transverse to the surface, the rotation crucible is configured to, in operation, receive liquid tin (Sn); a laser directed at the liquid Sn on the inner sidewall surface of the rotation crucible, the laser configured to, in operation, generate extreme-ultraviolet (EUV) light by being directed at the liquid Sn; a melting plate spaced inward from the inner sidewall surface of the rotation crucible, the melting plate configured to, in operation, heat a solid Sn insert to melt the solid Sn insert into new liquid Sn to be applied to the inner sidewall surface of the rotation crucible; and a heating element overlapping the melting plate, the heating element configured to, in operation, heat the melting plate to a temperature greater than a melting point of the solid Sn insert.

At least one embodiment of a method of the present disclosure may be summarized as including: heating a melting plate suspended from a surface of a rotation crucible with a heater element in close proximity to the melting plate, heating the melting plate including: melting a solid tin (Sn) insert in close proximity to the melting plate converting the solid Sn insert into liquid Sn; depositing the liquid Sn by gravity onto the surface of the rotation crucible; rotating the rotation crucible generating a centrifugal force moving the liquid Sn including: moving the liquid Sn through a space between an end of the melting plate suspended from the surface of the rotation crucible and along the surface of the rotation crucible; and applying the liquid Sn to an inner sidewall surface of the rotation crucible auto-filling the inner sidewall surface of the rotation crucible with the liquid Sn.

At least one embodiment of a system of the present disclosure may be summarized as including: a rotation crucible including a surface and an inner sidewall surface transverse to the surface; a liquid EUV fuel on the inner sidewall surface of the rotation crucible; a laser directed at the liquid EUV fuel on the inner sidewall surface of the rotation crucible; a melting plate spaced inward from the inner sidewall surface of the rotation crucible, the melting plate including: a first sidewall portion; a second sidewall portion opposite to the first sidewall portion; a third sidewall portion that extends from the first sidewall portion to the second sidewall portion, the third sidewall portion is transverse to the first sidewall portion and the second sidewall portion; and a space delimited by the first, second, and third sidewall portions, the space is further away from the inner sidewall surface relative to the third sidewall portion; and a heater element in close proximity to the melting plate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
   a rotation crucible including a surface and an inner sidewall surface transverse to the surface, the rotation crucible is configured to, in operation, receive liquid tin (Sn);
   a laser directed at the liquid Sn on the inner sidewall surface of the rotation crucible, the laser configured to, in operation, generate extreme-ultraviolet (EUV) light by being directed at the liquid Sn;
   a melting plate spaced inward from the inner sidewall surface of the rotation crucible, the melting plate configured to, in operation, heat a solid Sn insert to melt the solid Sn insert into new liquid Sn to be applied to the inner sidewall surface of the rotation crucible; and
   a heating element overlapping the melting plate, the heating element configured to, in operation, heat the melting plate to a temperature greater than a melting point of the solid Sn insert.

2. The system of claim 1, wherein the melting plate is suspended over the surface of the rotation crucible.

3. The system of claim 2, wherein the new liquid Sn melted by the melting plate passes through a space between an end of the melting plate and the surface of the rotation crucible.

4. The system of claim 3, wherein the rotation crucible is configured to, in operation, generate a centrifugal force on the new liquid Sn by the rotation crucible rotating applying the new liquid Sn to an inner sidewall surface of the rotation crucible auto-filling the inner sidewall surface with the new liquid Sn.

5. The system of claim 4, wherein the melting plate is stationary.

6. The system of claim 1, wherein the rotation crucible is configured to, in operation, rotate about a central rotation point.

7. The system of claim 1, wherein the melting plate is made of a tungsten material.

8. The system of claim 1, wherein the rotation crucible includes a boundary protrusion that protrudes from the surface of the rotation crucible, the boundary protrusion is spaced inward from the inner sidewall surface and is spaced inward from the melting plate.

9. A method, comprising:
   heating a melting plate suspended from a surface of a rotation crucible with a heater element in close proximity to the melting plate, heating the melting plate including:
      melting a solid tin (Sn) insert in close proximity to the melting plate converting the solid Sn insert into liquid Sn;
      depositing the liquid Sn by gravity onto the surface of the rotation crucible;
   rotating the rotation crucible generating a centrifugal force moving the liquid Sn including:
      moving the liquid Sn through a space between an end of the melting plate suspended from the surface of the rotation crucible and along the surface of the rotation crucible; and
      applying the liquid Sn to an inner sidewall surface of the rotation crucible auto-filling the inner sidewall surface of the rotation crucible with the liquid Sn.

10. The method of claim 9, further comprising exposing the liquid Sn to a laser to generate an extreme-ultraviolet (EUV) light.

11. The method of claim 10, wherein exposing the liquid Sn to the laser to generate the EUV light and rotating the rotation crucible generating the centrifugal force moving the liquid Sn occurs simultaneously.

12. The method of claim 9, wherein heating the melting plate suspended from the surface of the rotation crucible with the heater element in close proximity to the melting plate and rotating the rotation crucible generating the centrifugal force moving the liquid Sn occurs simultaneously.

13. The method of claim 9, wherein the melting plate is made of a tungsten material.

14. The method of claim 9, wherein applying the liquid Sn to the inner sidewall surface of the rotation crucible auto-filling the inner sidewall surface of the rotation crucible with the liquid Sn further includes replenishing respective liquid Sn already exposed to a laser previously to generate an extreme-ultraviolet (EUV) light.

15. A system, comprising:
   a rotation crucible including a surface and an inner sidewall surface transverse to the surface;
   a liquid EUV fuel on the inner sidewall surface of the rotation crucible;
   a laser directed at the liquid EUV fuel on the inner sidewall surface of the rotation crucible;
   a melting plate spaced inward from the inner sidewall surface of the rotation crucible, the melting plate including:
      a first sidewall portion;
      a second sidewall portion opposite to the first sidewall portion;
      a third sidewall portion that extends from the first sidewall portion to the second sidewall portion, the third sidewall portion is transverse to the first sidewall portion and the second sidewall portion; and
      a space delimited by the first, second, and third sidewall portions, the space is further away from the inner sidewall surface relative to the third sidewall portion; and
   a heater element in close proximity to the melting plate.

16. The system of claim 15, wherein a solid EUV fuel insert is inserted into the space of the melting plate, and the melting plate is configured to, in operation, be heated by the heater element to convert the solid EUV fuel insert into new liquid EUV fuel to replenish respective liquid EUV fuel on the inner sidewall surface previously exposed to the laser to generate an extreme-ultraviolet (EUV) light.

17. The system of claim 15, wherein the melting plate is a tungsten material.

18. The system of claim 15, includes a boundary protrusion that protrudes from the surface of the rotation crucible, the boundary protrusion is spaced inward from the inner sidewall surface and is spaced inward from the melting plate.

19. The system of claim 15, further comprising a motor in mechanical cooperation with the rotation crucible, and the motor is configured to, in operation, rotate the rotation crucible to generate a centrifugal force to apply new liquid EUV fuel to the inner sidewall surface.

20. The system of claim 19, wherein the heater element is configured to, in operation, heat the melting plate to form the new liquid EUV fuel by melting a solid EUV fuel.

* * * * *